US005591698A

United States Patent [19]
Song et al.

[11] Patent Number: 5,591,698
[45] Date of Patent: Jan. 7, 1997

[54] LOW TEMPERATURE (T LOWER THAN 950° C.) PREPARATION OF MELT TEXTURE YBCO SUPERCONDUCTORS

[75] Inventors: Steven Y. Song; James R. Gaines, both of Honolulu, Hi.

[73] Assignee: University of Hawaii, Honolulu, Hi.

[21] Appl. No.: 365,848

[22] Filed: Dec. 29, 1994

[51] Int. Cl.$^6$ .......................... C04B 35/653; C04B 35/505
[52] U.S. Cl. .......................... 505/450; 505/500; 505/725; 505/781; 252/521
[58] Field of Search ..................................... 505/100, 124, 505/450, 500, 725, 781; 252/518, 521

[56] References Cited

U.S. PATENT DOCUMENTS

| | | | |
|---|---|---|---|
| 4,994,437 | 2/1991 | Torii et al. | 505/1 |
| 5,032,570 | 7/1991 | Ogata et al. | 505/725 |
| 5,137,867 | 8/1992 | Ray et al. | 505/725 |
| 5,432,143 | 7/1995 | Pellerin et al. | 505/450 |

OTHER PUBLICATIONS

Shimoyama et al "Addition of new Pinning Center to Unidirectionally Melt Solidified Y–Ba–Cu–O Superconductor" Jap. Journ. of App. Physics, vol. 29, No. 11, Nov. 1990 pp. L1999–2001.

Matsuzaki et al "High–$T_c$ Superconductor Prepared by Oxidation of a Mechanically Allayed Nonequilibrium fcc $Ba_2YCu_3$ Phase" Jap. Journ. of App. Physics, vol. 27, No. 5, May '88 pp. L779–L782.

*Primary Examiner*—Erin M. Harriman
*Assistant Examiner*—M. Kopec
*Attorney, Agent, or Firm*—Flehr, Hohbach, Test, Albritton & Herbert

[57] ABSTRACT

A melt textured growth process for bulk YBCO at temperatures below 950° C. is provided so that the material (YBCO) can be combined with silver to produce bulk superconductors by providing a combination of precursors that provide melting at 950° C. or lower temperatures. After melting of the thoroughly mixed precursors, the sample is cooled in a controlled temperature environment. The process makes it possible to use metallic silver or other normal metals such as gold, as components in the fabrication of long YBCO wires and cables while achieving a high critical current density.

11 Claims, 3 Drawing Sheets

LOW TEMPERATURE (T LOWER THAN 950° C.) PREPARATION OF MELT TEXTURE YBCO SUPERCONDUCTORS

FIELD OF THE INVENTION

The present invention relates to fabrication methods for high temperature superconducting materials, more particularly to melt texturing fabrication methods for bulk high temperature superconducting materials.

The discovery of high critical temperature superconducting oxides, including a number of materials which superconduct above liquid-nitrogen temperature, has stimulated considerable interest and activity. A limit to application of these materials is the low-critical current density Jc measured in bulk polycrystalline samples. Several fabrication techniques to increase transport Jc have been reported in the conventional literature. Magnetic field alignment, melt-textured growth, and liquid phase methods can significantly enhance Jc values. Currently, further fabrication techniques for the preparation of $YBa_2Cu_3O_x$ superconductors and the products thereof have been proposed. However, if these superconductors are to be practically useful, the transport critical current density should be greater than 10,000 A/cm$^2$ at liquid nitrogen temperature (77 K). These $YBa_2Cu_3O_x$ superconductors obtained from general sintering methods possess a transport critical current density from 150 to 600 A/cm$^2$ at 77 K. However, these values are far below the applicable range. The transport critical current density of a single crystal may be greater than $10^4$ A/cm$_2$, but the size of the product is small, which cannot be used in practice. The transport critical current density of epitaxially grown thin films may be greater than $10^6$ A/cm$^2$, but the film is thin, and the critical current (Ic) can only reach a maximum of about 3 to 5 amp (A). Besides, the thin film must be deposited onto an expensive single crystal substrate. Thus, the product obtained in accordance with prior processes is not very useful.

The brittleness and the weak-link behavior at grain boundaries are two challenging problems hindering most practical applications of bulk copper oxide superconductor materials. The melt texture growth (MTG) method (S. Jin, R. C. Sherwood, E. M. Gyorgy, T. H. Tiefel, R. B. Van Dover, S. Nakahara, L. F. Schneemeyer, R. A. Fastnacht, and M. E. Davis, Appl. Phys, Lett. 54, 584 (1989)), melt powder melt growth (MPMG) method (M. Murakami et al, Modern Phys. Lett. B 4, 163 (1990)), and other similar methods (K. Salama, V. Selvamanickam, and D. F. Lee, in *Processing and Properties of High Tc Superconductors,* edited by S. Jin (Work Scientific, Singapore, 1992)) have been developed to overcome the weak-link problem. On the other hand, incorporation of metallic silver into the copper oxide materials has proven to be critically important, because silver may help overcome the brittleness and also enhance the critical current density. At the present time, long wires made of Bi—Sr—Ca—Cu—O and silver have been fabricated by a number of research groups (K. Sato, N. Shibuta, H. Mukai, T. Hikata, M. Ueyama, and T. Kato, J. Appl. Phys. 70, 6484 (1991), K. Togano, H. Kumakura, K. Kadowaki, H. Hitaguchi, H. Maeda, J. Kase, J. Shimoyama, and K. Nomura, Cryogenic Eng. 38, 1081 (1992), P. Haldar, J. G. Hoehn, Jr., U. Balachandran, and L. R. Motowidlo, Proc. Symp. on "Processing of Long Lengths of Superconductors", 1993 TMS-AIME Fall Meeting, Pittsburgh, 1993). This success can be attributed to the relatively low melting point of the Bi—Sr—Ca—Cu—O compound and its strong c-axis texture. However, the Bi—Sr—Ca—Cu—O compound is plagued by the flux creep problem at temperatures above 30 K and in magnetic fields greater than 1 T, limiting its usefulness to a narrow temperature and field range (S. Jin, Proc. Symp. on "Processing of Long Lengths of Superconductors", 1993 TMS-AIME Fall Meeting, Pittsburgh, 1993).

$YBa_2Cu_3O_{7-\delta}$ (YBCO) has the potential to yield a high critical current density even in very high fields. However, fabrication of long-length wires and cables of YBCO has been hindered by the high melting temperature of YBCO (its peritectic point is approximately 1015° C.) which is well above the melting temperature of silver (960° C.), making it very difficult to combine silver with the conventional MTG or other similar processes. Fabricating well-textured YBCO in combination with silver below its peritectic point has become of much current interest (S. Jin, Proc. Symp. on "Processing of Long Lengths of Superconductors", 1993 TMS-AIME Fall Meeting, Pittsburgh, 1993; V. Selvamanickam, A. Goyla, and D. M. Kroeger, Appl. Phys. Lett. 65, 639 1994).

SUMMARY OF THE INVENTION

It is an objective of the present invention to provide an improved method for forming bulk copper oxide superconductive materials.

More specifically, it is an objective of the invention to form bulk oxide superconductors by a method which overcomes the brittleness and/or weak link behavior at grain boundaries.

It is a further objective of the invention to combine YBCO and silver, in a bulk copper oxide superconductor.

It is a further and more specific objective to provide a method of formulating a melt textured YBCO and silver so that the highest temperature utilized is 950° C., i.e. below the melting point of silver, thereby solving many of the problems created by the normally high melting temperature of YBCO.

It is a further objective of the invention to provide an effective melt textured growth process for bulk YBCO at temperatures below 950° C. so that the material (YBCO) can be combined with silver to produce bulk superconductors in the wires/cables form that can carry superconducting critical current density of 10,000 A/cm$^2$ or higher at 77 K.

In summary, according to the method of the present invention, the high preparation temperatures (typically ≧1050° C.) used in conventional melt textured growth processes are avoided by averting peritectic melting of YBCO. Instead, according to the present invention, a combination of precursors are utilized that provide melting at 950° C. or lower temperatures. After melting of the thoroughly mixed precursors, the sample is cooled in a controlled temperature environment. The disclosed process makes it possible to use metallic silver or other normal metals such as gold, as components in the fabrication of long YBCO wires and cables while achieving a high critical current density.

It should be noted that while we have used the symbol YBCO to describe a specific high temperature superconductor material $YBa_2Cu_3O_7$, the present invention is useful with many possible modifications of the compound, including complete or partial replacement of the element ytrium (Y) by other rare earth elements, by using differed stoichiometries of Y, Ba$_2$, Cu, as well as using different oxygen contents. Also, while silver is highly useful in achieving the goals of this invention and is well adapted to being incorporated in the described process, other normal metals such as gold are also highly useful and are intended to be included within the scope of the invention.

The invention will be better understood by reference to the following figures and the accompanying description of a preferred embodiment.

FIG. 1 The powder X-ray diffraction patterns of a sample prepared by the LTMTG process.

FIG. 2 The SEM micrographs obtained on the fractured surface of a sample.

FIG. 3 The critical current density as a function of the applied magnetic field H. The sample has a thin-slab geometry and its thickness is about 1.0 mm. Inset: the hysteresis curves measured at 5 K and 77 K, respectively. For both panels, the vertical axis is the magnetization in units of emu/cc and the horizontal axis is the externally applied magnetic field in units of kOe.

DETAILED DESCRIPTION OF A PREFERRED EMBODIMENT

Figure 1:
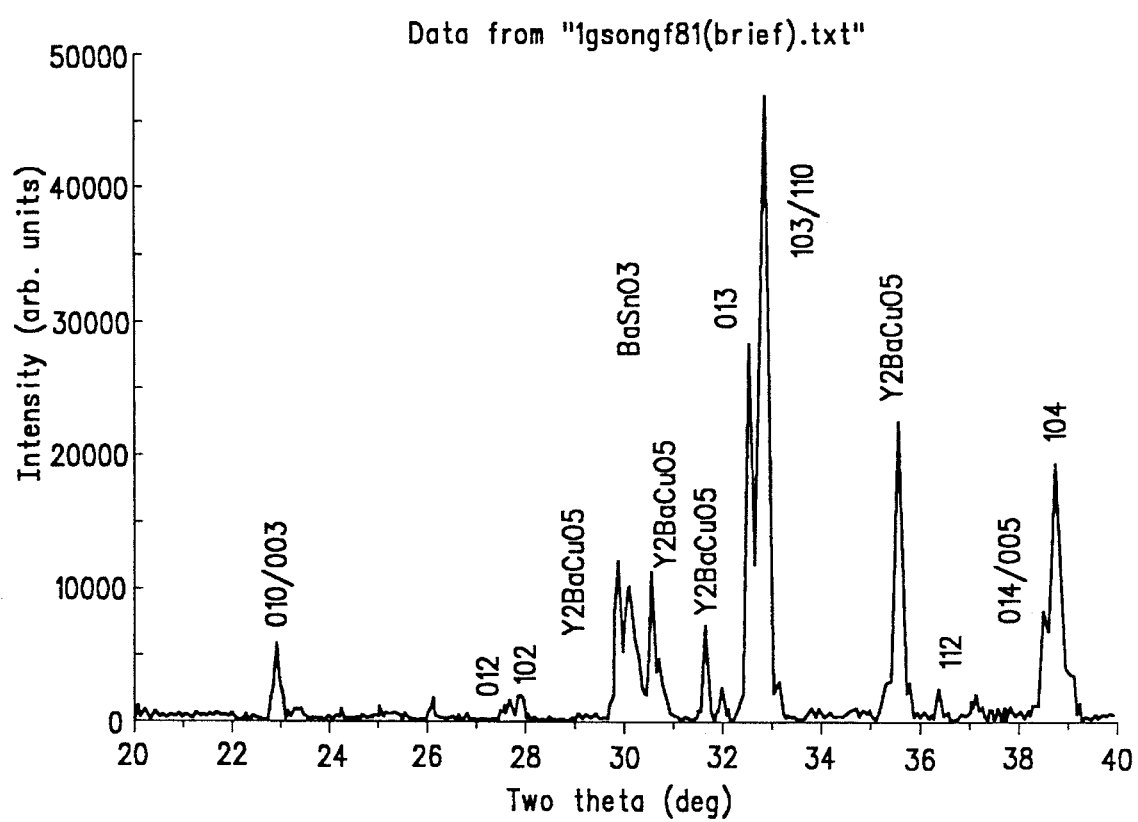

A new low temperature melt texture growth (LTMTG) process for bulk $YBa_2Cu_3O_{7-\delta}$ is described below as a specific example of the present invention. The high preparation temperature (typically $\geq 1050°$ C.) used in the conventional MTG process is eliminated by averting peritectic melting of $YBa_2Cu_3O_{7-\delta}$. Instead, a combination of precursors is used that results in a liquid state at 950° C., the highest heating temperature during the LTMTG process. The new preparation procedure makes it possible to use metallic silver as a vital component in the fabrication of long YBCO wires and cables with high critical current densities, therefore promising a great potential for large scale applications of bulk YBCO materials.

Three precursors, $Y_2BaCuCO_5$, $BaCuO_2$, and $BaSnO_3$ were first prepared using the solid state reaction method. The detailed starting material compositions and the thermal treatment parameters for these precursors are given in Table I. The LTMTG process began with mixing precursors and commercially available CuO according to the following molecular ratio: $Y_2BaCuO_5:BaCuO_2:CuO=1:3:5.28$. The excessive use of CuO reflects the essential concept that a proper combination of $BaCuO_2$ and CuO may result in a liquid state at 950° C. This liquid state then reacts with the Yttrium rich precursor ($Y_2BaCuO_5$) to form the desired $YBa_2CuO7-\delta$ phase. Preliminary experiments indicate that adding even more CuO may further reduce the melting temperature below 950° C., but the overall normal state and superconducting state properties would be adversely affected if too much CuO were present. To enhance the magnetic flux pinning ability, 5 wt % (with respect to the total weight of $Y_2BaCuO_5$, $BaCuO_2$, and CuO) of $BaSnO_3$ precursor was added to the mixture. After thorough mixing and grinding, the precursors were pressed into rectangular pellets with dimensions 24×8×2 mm$^3$. The pellets were loaded into an alumina crucible with a platinum wire attached. The crucible was quickly introduced into a tube furnace preheated to 950° C. with a temperature gradient 3.5° C./cm. A slow motor was used to pull the platinum wire so that the crucible gradually moved to the lower temperature region. The motor rotated one revolution per 24 hours, corresponding to a crucible travelling speed of 0.3 cm/hour. After the crucible travelled for 72 hours (with the sample temperature at approximately 874° C.), the slow motor was turned off. The samples were then allowed to cool to 480° C. (15° C./h). Oxygen annealing was carried out at 480° C. for 24 h. As prepared pellets appeared to be noticeably smaller than the raw pellets, mainly because of the solidification of grains but also, partially, because of the loss of a small amount of Ba and Cu rich liquid.

Standard dc four-probe measurements were performed to determine the superconducting transition temperature $T_c$ and the normal state resistivity $\rho$. The resistive superconducting transition is very sharp, characteristic of the dominant $YBa_2Cu_3O_{7-\delta}$ phase. Detailed data of $T_c$ and $\rho$ are presented in Table II. The normal state resistivity of our samples is approximately four times that of pure bulk $YBa_2Cu_3O_{7-\delta}$, suggesting the existence of some impurity phases. The phase structure of the samples was examined by powder X-ray diffraction technique using a Sintag diffractometer with characteristic copper $K\alpha$ radiation of wavelength 1.5490 Å. A scanning electron microscope (SEM) was used to analyze the sample microstructure. The critical current density was studied by measuring the magnetization by hysteresis curves at 77 K and 5 K, using a Lake Shore 7229 DC Magnetometer. We are indebted to B. C. Dodrill at Lake Shore Cryotronics, Inc. for help in the magnetization measurements.

FIG. 1 is the powder X-ray diffraction pattern of samples prepared by the LTMTG method. A major phase of $YBa_2Cu_3O_{7-\delta}$ perovskite structure is the dominant phase and a second phase of $Y_2BaCuO_5$ is also clearly seen. The presence of $BaSnO_3$ is indicated by the feature near $2\theta=30.1°$. The spectrum lines of the $YBa_2Cu_3O_{7-\delta}$ phase were all indexed and the d spacings of these lines were determined from the diffraction pattern. The lattice constants were calculated using a least-squares fit program. The results are listed in Table III, showing a clear orthorhombic structure for $YBa_2Cu_3O_{7-\delta}$. The $Y_2BaCuO_5$ phase in FIG. 1 makes a rather large contribution. Since $Y_2BaCuO_5$ is an electrically insulating phase, its existence is consistent with the large normal state electrical resistivity shown in Table II.

Figure 2:
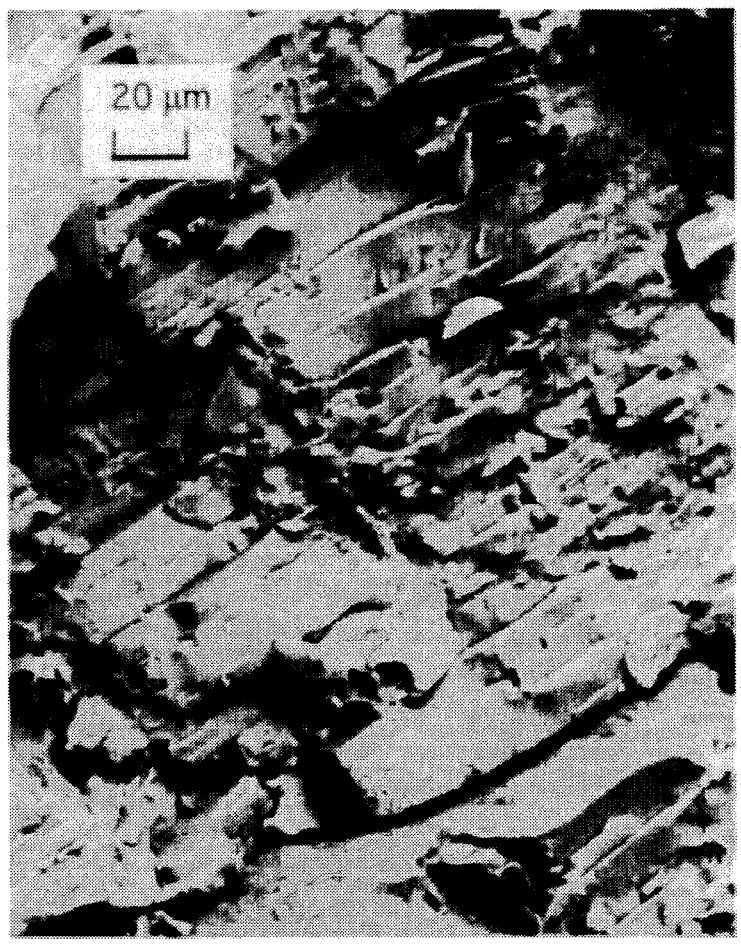

FIG. 2 shows a SEM micrograph taken on a fractured surface of a sample prepared by the LTMTG process. It can be seen that there are essentially no voids present, which is a desirable result of melting at 950° C. followed by directional solidification. The main structural feature in FIG. 2 is the layered platelet structure of $YBa_2Cu_3O_{7-\delta}$. The typical layer thickness of the $YBa_2Cu_3I_{7-\delta}$ plates ranges from 15 to 30 μm. The formation of the platelet structure is clear evidence of successful melt textured growth. The alignment of the $YBa_2Cu_3O_{7-\delta}$ plates is highly favorable for achieving large critical current density because it may effectively reduce the weak link behavior at grain boundaries. There are some round and sharp edged particles present with the particle size ranging between 5 to 15 μm. These particles may represent the $Y_2BaCuO_5$, $BaSnO_3$, and other minor Ba—Cu rich phases.

Figure 3:
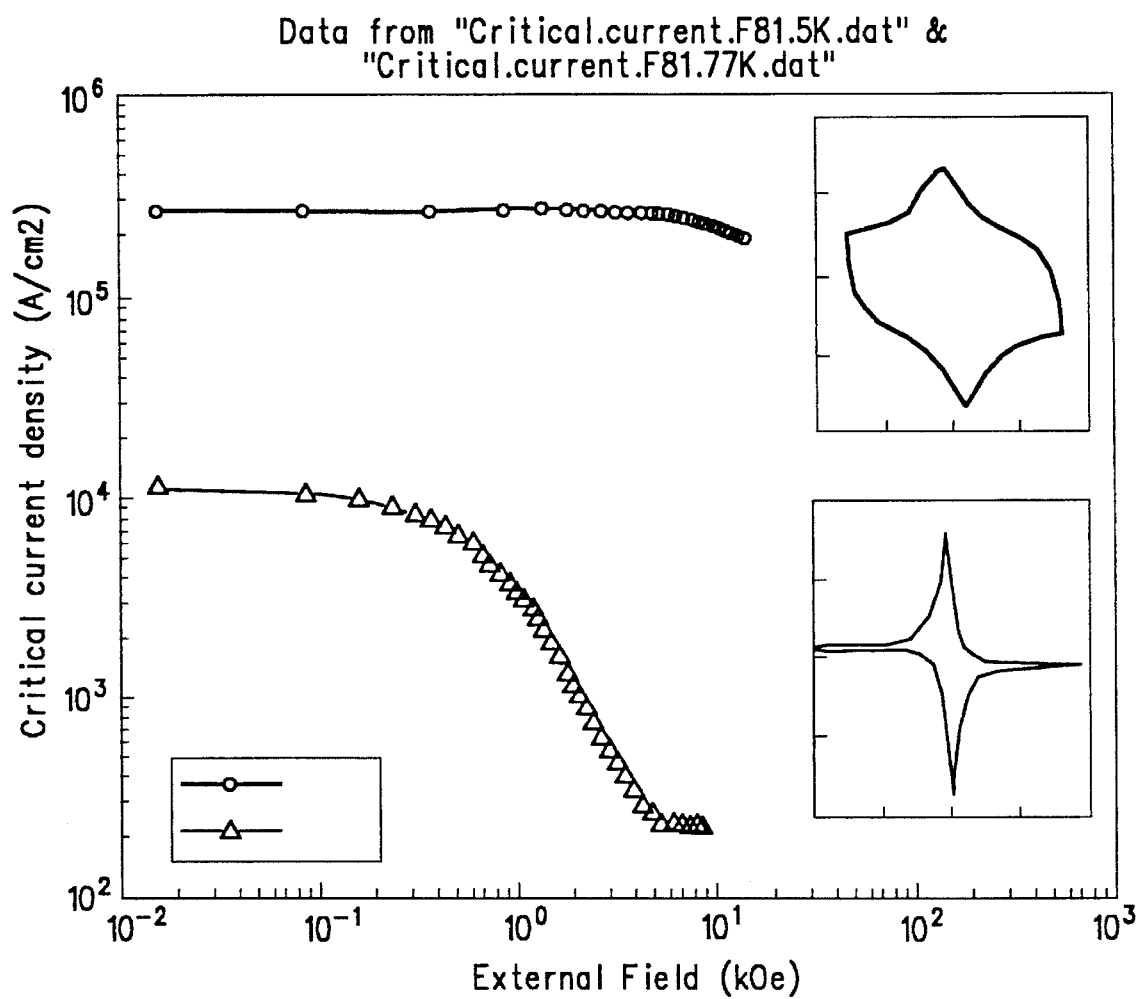

In FIG. 3 the critical current density (Jc) data is plotted as a function of the externally applied magnetic field (H). The critical current density was calculated from the DC magnetization hysteresis curves shown in the inset, using Bean's critical state model (C. P. Bean, Phys. Rev. Lett. 8, 250, 1962). For the 77 K measurement, Jc=$1.1 \times 10^4$ A/cm$^2$ at H=0. The magnitude of Jc slowly decreases with the applied magnetic field. When H is above 0.5 kOe, Jc decreases more rapidly with H. At H=1 kOe, Jc/Jc(H=0) is approximately 35%. For the 5 K measurement, we obtain a larger value Jc=$2.7 \times 10^5$ A/cm$^2$ at H=0 and Jc does not decrease significantly with H until 40 kOe. The Jc values of these samples are about 100 times higher than those of sintered YBCO, and approximately a factor of 2 smaller than the fully optimized results obtained on small samples prepared by the conventional MTG process. This LTMTG technique will allow the use of metallic silver to fabricate composite cables and wires of YBCO that have the best superconducting critical density of the copper oxide superconductors over a wide temperature and magnetic field range.

In summary, the above is an example of a new low temperature melt texture growth (LTMTG) process for bulk $YBa_2Cu_3O_{7-\delta}$. The highest heating temperature in this process is 950° C. This LTMTG process makes it feasible, in practice, to incorporate metallic silver in the fabrication of long YBCO wires and cables. This process provides an effective solution to the problems of the brittleness and the low critical current density in bulk $YBa_2Cu_3O_{7-\delta}$, bringing large scale applications of bulk YBCO materials one step closer to reality.

It can be seen that with appropriate selection of precursors that a superconductor represented by the following $RE_nBa_mCu_oO_p\lambda_q$ can be formulated, where RE=Y, La, Nd, Sm, Eu, Gd, Dy, Ho, Er, Tm, Yb, Lu, or any combination of above where $\lambda$=a non rare earth metal such as preferably Ag and Au n=pref 1
m=pref 2
o=pref 3
p=pref 6.8–7.0
q=0–50

Examples of alternative stoichiometries could thus be:

$YBa_2Cu_3O_{6.9}Ag_6$
$DyBa_2Cu_3O_{7.0}Ag_{12}$

Other alternations to the present invention may be apparent to a person of skill in the art who studies the present invention disclosure. Therefore the invention should be limited only by the following claims.

TABLE I

Preparations for the three precursors. The staring materials are commercially available oxide powders with purity 99.9% or better.

| Precursor Name | Starting materials and molecular ratios | Thermal treatment |
|---|---|---|
| $Y_2BaCuO_5$ | $Y_2O_3$:$BaCO_3$:CuO = 1:1:1 | 900° C. in air, 12 h |
| $BaCuO_2$ | $BaCO_3$:CuO = 1:1 | 900° C. in air, 12 h |
| $BaSnO_3$ | $BaCO_3$:$SnO_2$ = 1:1 | 900° C. in air, 16 h |

TABLE II

The superconducting transition temperature and electrical resistivity data.

| Tc | 89.5K |
|---|---|
| transition width | <1.5K |
| resistivity at 100K | 2.42 mΩ · cm |
| | 5.64 mΩ · cm |

TABLE III

The lattice constants of the $YBa_2Cu_3O_{7-\delta}$ phase (all in units of Å).

| a | b | c |
|---|---|---|
| 3.8140 ± 0.0031 | 3.8806 ± 0.0024 | 11.6435 ± 0.0074 |

What is claimed is:

1. A method for making superconducting material comprising YBCO and silver comprising selecting CuO and at least one precursor selected from the group consisting of $BaCuO_2$ and $Y_2BaCuO_5$, mixing said precursors with other precursors in stoichiometric proportions necessary to form the superconducting material, and with metallic silver to form a mixture to be processed, melt texturing said mixture by heating said mixture in a furnace region heating to no more than about 950° C., and moving said mixture slowly to a lower temperature region, then cooling a resulting sample in a controlled temperature environment, wherein during said process peritectic melting of $YBa_2Cu_3O_{7-y}$ is averted.

2. The method of claim 1 wherein one of said precursors included $BaCuO_2$ and the other of said precursors includes CuO.

3. The method of claim 2 wherein one of said precursors is $Y_2BaCuO_5$.

4. The method of claim 2 further including the step of adding $BaSnO_3$ precursor to the mixture prior to melt texturing to enhance magnetic flux pinning ability.

5. The method of claim 3 wherein said precursors are present in a molecular ratio of about ½ $BaCuO_5$:$BaCuO_2$:CuO=1:3:5.28 5.28:3:1.

6. The method of claim 5 wherein said mixture includes the step of adding further CuO prior to melt texturing to reduce the melting temperature.

7. The method of claim 2 wherein said heating step occurs in a tube furnace having a temperature at the region where the mixture is introduced of about 950° C., and a temperature gradient of 2° to 10° C./cm.

8. The method of claim 7 wherein the mixture during the melt textured growth process, moves from said region of 950° C. to a region of 874° C.

9. The method of claim 8 wherein said mixture, following said melt textured growth, is cooled at a controlled rate to about 480° C.

10. The method of claim 9 wherein said cooled, treated mixture is oxygen annealed.

11. The method of claim 4 wherein the amount of $BaSnO_3$ added is 5 wt % with respect to the total weight of said precursors.

* * * * *